United States Patent
Hunter et al.

(10) Patent No.: US 6,573,473 B2
(45) Date of Patent: Jun. 3, 2003

(54) METHOD AND SYSTEM FOR PRECISELY POSITIONING A WAIST OF A MATERIAL-PROCESSING LASER BEAM TO PROCESS MICROSTRUCTURES WITHIN A LASER-PROCESSING SITE

(75) Inventors: Bradley L. Hunter, Lexington, MA (US); Steven P. Cahill, Newton, MA (US); Jonathan S. Ehrmann, Sudbury, MA (US); Michael Plotkin, Newton, MA (US)

(73) Assignee: General Scanning Inc., Wilmington, MA (US)

( * ) Notice: Subject to any disclaimer, the term of this patent is extended or adjusted under 35 U.S.C. 154(b) by 28 days.

(21) Appl. No.: 10/001,104

(22) Filed: Nov. 2, 2001

(65) Prior Publication Data

US 2002/0125231 A1 Sep. 12, 2002

Related U.S. Application Data

(62) Division of application No. 09/572,925, filed on May 16, 2000, now Pat. No. 6,483,071.

(51) Int. Cl.[7] .............................................. B23K 26/02
(52) U.S. Cl. .................................................. 219/121.69
(58) Field of Search ......................... 219/121.6, 121.61, 219/121.62, 121.67, 121.69, 121.81, 121.78; 356/401, 399, 400, 623; 250/559.31, 559.23

(56) References Cited

U.S. PATENT DOCUMENTS

| | | | |
|---|---|---|---|
| 4,475,223 A | 10/1984 | Taniguchi et al. | |
| 4,528,451 A | 7/1985 | Petric et al. | |
| 4,584,479 A | 4/1986 | Lamattina et al. | |
| 4,615,621 A | 10/1986 | Allen et al. | |
| 4,675,501 A | 6/1987 | Klingel | |
| 4,685,054 A | 8/1987 | Manninen et al. | |
| 4,710,908 A | 12/1987 | Ohshima et al. | |
| 4,769,523 A | 9/1988 | Tanimoto et al. | |
| 4,849,901 A | 7/1989 | Shimizu | |
| 5,134,298 A | 7/1992 | Inagaki et al. | |
| 5,340,962 A | 8/1994 | Schmidt et al. | |
| 5,386,294 A | 1/1995 | Ototake et al. | |
| 5,594,235 A | 1/1997 | Lee | |
| 5,690,785 A | 11/1997 | Nakaya | |
| 5,783,814 A | 7/1998 | Fairley et al. | |
| 5,998,759 A | 12/1999 | Smart | |
| 6,036,162 A | * 3/2000 | Hayashi | ...................... 248/550 |
| 6,177,998 B1 | 1/2001 | Svetkoff et al. | |
| 6,198,982 B1 | 3/2001 | Park et al. | |
| 6,215,896 B1 | 4/2001 | Greig et al. | |

OTHER PUBLICATIONS

General Scanning, Inc., Laser Link Fusing, Somerville, MA, Jan. 1997.
Kuttner, P., Laser Beam Scanning, Marcel Dekker Inc., XP–002182152, New York, 1985.
Marcel Dekker, Inc., Laser Beam Scanning, Opto–Mechanical Devices, Systems, and Data Storage Optics, Chapter 7, Optics for Data Storage, pp. 303–305, 384–387 1985.
Electro Scientific Industries, Inc., 9300 Memory Yield Improvement, 1998, 2 pages.
Electro Scientific Industries, Inc., 9350 Laser Semiconductor Processing System, 2001, 2 pages.

* cited by examiner

*Primary Examiner*—Tom Dunn
*Assistant Examiner*—Jonathan Johnson
(74) *Attorney, Agent, or Firm*—Brooks & Kushman P.C.

(57) ABSTRACT

A high-speed method and system for precisely positioning a waist of a material-processing laser beam to dynamically compensate for local variations in height of microstructures located on a plurality of objects spaced apart within a laser-processing site are provided. In the preferred embodiment, the microstructures are a plurality of conductive lines formed on a plurality of memory dice of a semiconductor wafer. The system includes a focusing lens subsystem for focusing a laser beam along an optical axis substantially orthogonal to a plane, an x-y stage for moving the wafer in the plane, and a first air bearing sled for moving the focusing lens subsystem along the optical axis.

37 Claims, 7 Drawing Sheets

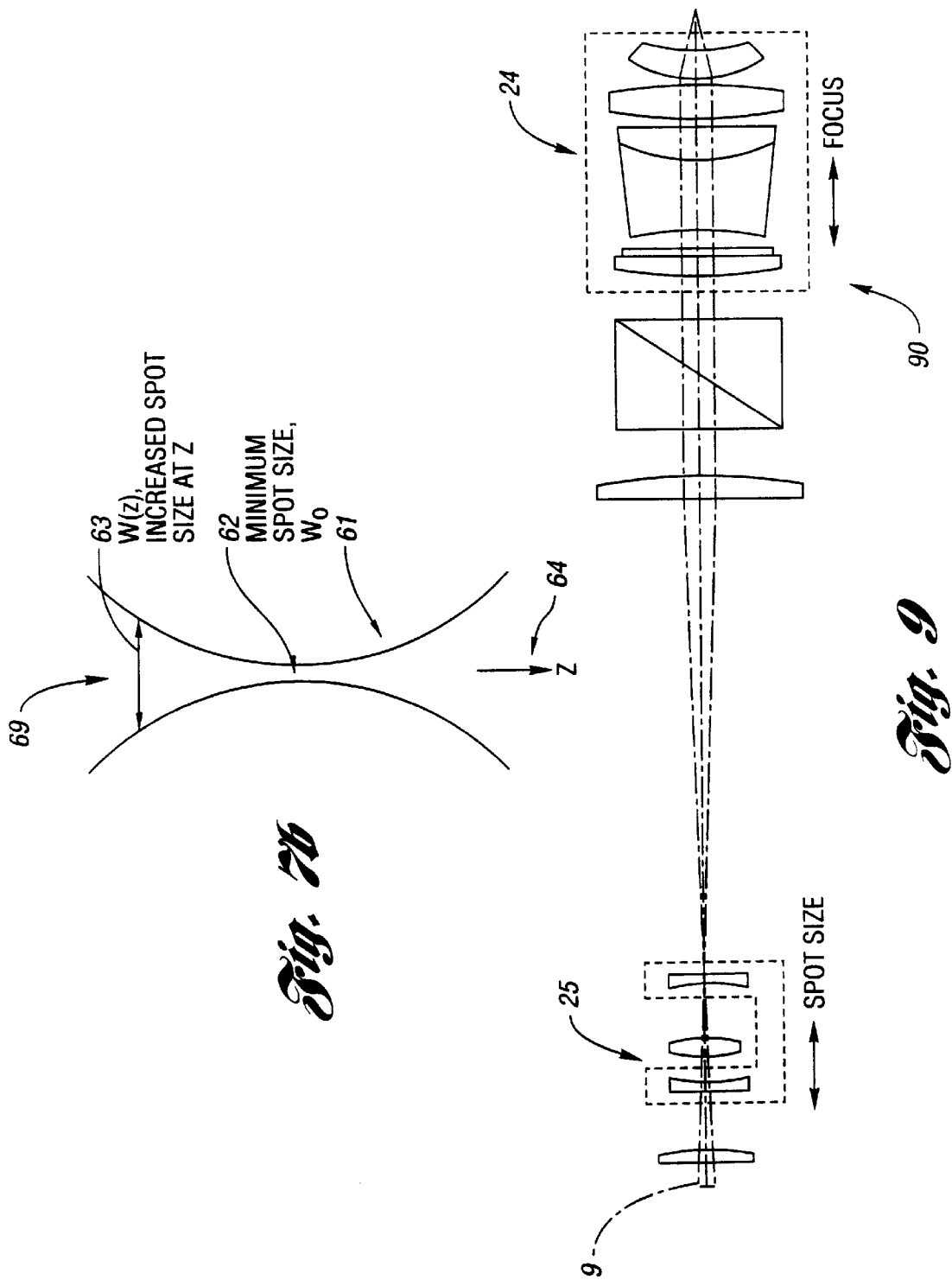

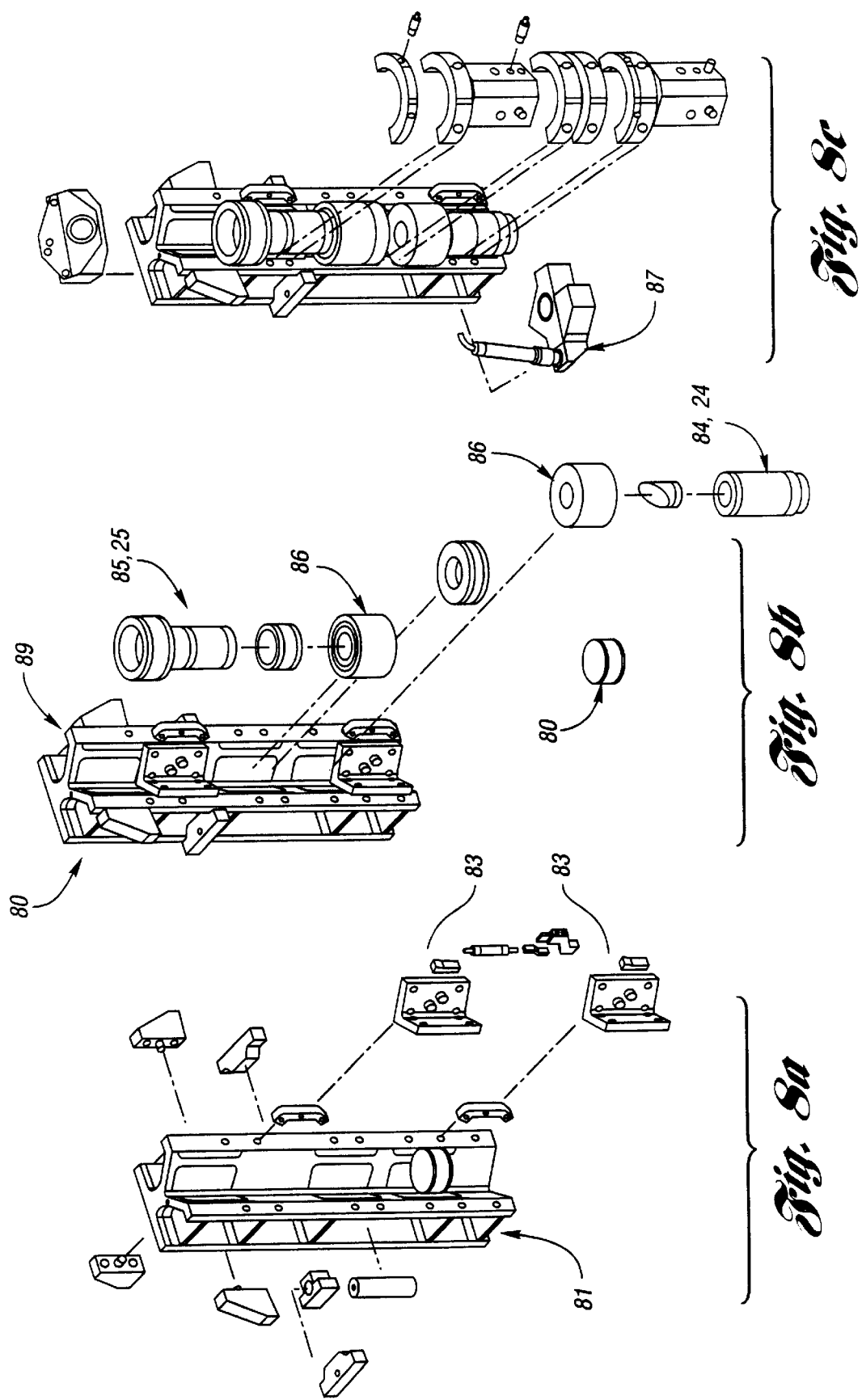

METHOD AND SYSTEM FOR PRECISELY POSITIONING A WAIST OF A MATERIAL-PROCESSING LASER BEAM TO PROCESS MICROSTRUCTURES WITHIN A LASER-PROCESSING SITE

CROSS REFERENCE TO RELATED APPLICATIONS

This is a divisional of application Ser. No. 09/572,925 filed on May 16, 2000 now U.S. Pat. No. 6,483,071.

This application is also related to provisional patent application entitled "Trajectory Generation And Link Optimization", filed the same day as the present application. Also, this application is related to U.S. patent applications entitled "Precision Positioning Apparatus" filed on Sep. 18, 1998 and having U.S. Ser. No. 09/156,895, now U.S. Pat. No. 6,114,118 and "Energy Efficient Laser-Based Method and System for Processing Target Material" filed on Dec. 28, 1999 and having U.S. Ser. No. 09/473,926 now U.S. Pat. No. 6,281,471.

TECHNICAL FIELD

This invention generally relates to methods and systems for high speed laser processing (machining, cutting, ablating) microstructures. More specifically, this invention relates to methods and systems for precisely positioning a waist of a material-processing laser beam to process microstructures within a laser-processing site. Semiconductor memory repair is a specific application where precise positioning in depth of the beam waist of the laser beam is required to dynamically compensate for local variations in height of the wafer or target surface.

BACKGROUND ART

Memory Repair is a process used in the manufacture of memory integrated circuits (DRAM or SRAM) to improve the manufacturing yield. Memory chips are manufactured with extra rows and columns of memory cells. During testing of the memory chips (while still in the wafer form), any defects found are noted in a database. Wafers that have defective die can be repaired by severing links with a pulsed laser. Systems generally utilize wafer-handling equipment that transports semiconductor wafers to the laser process machine, and obtain the information in the form of an associated database specifying where the links should be cut and performs the requisite link ablation for each wafer.

Successive generations of DRAM exploit finer device geometry in order to pack more memory into smaller die. This manufacture of smaller devices affects the geometry of the links allocated for laser redundancy. As the devices get smaller, the links get smaller and the pitch (link-to-link spacing) shrinks as well. Smaller link geometry requires a smaller spot size from the laser in order to successfully remove selected links without affecting adjacent links, preferably with little if any compromise in throughput.

All systems focus the laser-processing beam to perform memory repair and require that the surface of the link be maintained within a small tolerance of the beam waist (focus) position with depth. When the link is in the focal plane of the lens, the focused spot will be minimum size. At focus or "beam waist height" above or below nominal, the spot will be defocused with the magnitude of defocus increasing with distance from nominal. A defocused spot reduces the energy that is delivered to the target link possibly leading to insufficient cutting of the link. A defocused spot may also place more laser energy on adjacent links or on the intervening substrate leading to possible substrate damage. At some level of defocus, the laser cutting process is no longer viable.

The allowable tolerance for relative placement of the lens and link is referred to as "depth of focus" (DOF). The depth of focus criteria is a function of the process tolerance for the particular link and laser combination. Experiments are typically performed over a range of operating parameters, including focus height, in order to determine the sensitivity of the laser cutting process to the parameters. For instance, from these experiments it might be found that the laser would reliably sever links when the combinations may exhibit more or less process latitude to focus height.

Prior generation memory repair systems perform a focus operation once per site. As more dies are processed within a single site, the site dimensions get larger. This presents a problem in that the wafers seldom are flat (planar) and parallel to the focal plane. If focus is performed at only one point within a site, then the system will operate slightly out of focus at points within the site that are not near to the focus location.

At least three factors affect the ability of a memory repair system to maintain the link in focus.

1. The process or sensor used to measure focus may exhibit errors.
2. The wafer may exhibit "topology" that requires different focus heights at different locations over the surface of the wafer.
3. The mechanism used to provide relative motion between the wafer surface and focal plane may exhibit errors.

A process for compensating height variations was used in 1992 by a predecessor company of the assignee of the present invention (i.e. "GSI") to perform thin-film trimming on integrated circuits (IC) in non-wafer form. At the time, IC's were being packaged into sensors and then trimmed after packaging. The problem encountered at the time was due to the packaged die being significantly non-parallel to the surrounding package (typically pressure sensors). Incorporating a Z-Roll-Pitch mechanism for positioning the device in the product solved the problem at the time. An auto-collimator sensor was included in the optical path and used to measure the angle of the die surface relative to the focal plane. The angular information from the auto-collimator was combined with a single focus measurement to define a plane. The mechanism then moved the die in 3 axes to place the die into the best-fit plane compensating for Z, roll and pitch. The range of die tilting was sufficiently large that it was often necessary to perform iterative corrections to properly focus the die. After making an adjustment in Z, roll and pitch, a second set of focus and tilt measurements was made followed by a subsequent (smaller) focus and tilt correction.

One problem of this approach is that the auto-collimator worked best when it could be directed at a large "planar" object. With pressure sensors, it was often possible to define a large region that lacked surface features in order to use as an auto-collimator target. It would not be possible to find such a region on a typical IC found in memory repair applications.

In 1994, GSI developed a different approach to handle thin-film trimming on "tilted die." The problem was again due to trimming on packaged IC (pressure sensors). In this case, the specifics of the customer's device precluded the use of a tilting Z-stage. A single Z-axis stage was used in the product and the Z-stage was moved in coordination with X and Y positioning of the laser beam. Also, the absence of suitable target structures for the auto-collimator on certain customer's devices forced GSI to develop the multi-site focus algorithm. Height measurements were obtained using a sensor that obtained a sequence of measurements along the z-axis from which the position of best focus was correlated to surface position—a prior art method known as "depth from focus". The process was repeated at 3 non-collinear locations. A best-fit plane (exact in the case of 3 points) was used to coordinate the movement of the device that was mounted to the Z-stage.

Prior art laser-based, dynamic focus techniques and/or associated "depth from focus" are widely used over a range of scales and at various operating speeds. Exemplary systems operating at a microscopic scale are disclosed in U.S. Pat. Nos. 5,690,785, 4,710,908, 5,783,814, and 5,594,235, and selected pages of Chapter 7 entitled "Optics for Data Storage" in the book "Laser Beam Scanning" by Marcel Dekker, Inc., 1985. A desirable improvement in the memory processing or the processing of other microstructures would provide capability to generate and apply industry-leading small spot sizes to the applications with improved throughput. In turn, an improved figure of merit for resolution and speed in the presence of local depth variations which substantially exceed the DOF associated with the small spot sizes.

DISCLOSURE OF INVENTION

An object of the present invention is to provide a high-speed method and system for precisely positioning a waist of a material-processing laser beam to process microstructures within a laser-processing site.

It is an object of the invention to provide a method and system for high-speed laser processing of microstructures on a surface having three-dimensional coordinates wherein the surface has substantial local warpage, wedge, or other variations in depth. The variations introduce a requirement for high speed, 3-dimensional relative motion of the target and laser beam, within a die site for example, so as to dynamically and accurately position the beam waist. The beam waist, which may be less than 1 um in depth, is to substantially coincide with the 3D location of the microstructure.

It is an object of the invention to provide an improved "speed-resolution product" in 3 dimensions-where the control system for the wafer movement preferably provides movement in 2 directions, and the high precision lens actuator provides beam focusing (e.g.: positioning of the beam waist) action in the third dimension.

It is an object of the invention to reduce the alignment time of the process by estimating a surface which is used to define a trajectory thereby eliminating or minimizing any requirement for die-by-die alignment or die-by-die focus measurements.

It is an object of the invention to maintain the correct focus height (i.e.: beam waist position) over the entire site (i.e.: several dice of a wafer), thereby improving over prior art focus solutions capable of only maintaining focus at locations adjacent to the focus location.

It is an object of the invention is to process dice on a wafer with a single "site." The field size may allow as many as six or eight 64M DRAM dice to be processed at one time. This process is called multi-die align (MDA). The use of MDA affords a significant throughput improvement by reducing the number of alignment operations required to process the wafer from 1-per die to 1-per site. The prior art alignment operations may require roughly the same amount of time to perform as link cutting for a single die.

In carrying out the above objects and other objects of the present invention, a method for precisely positioning a waist of a material-processing laser beam to dynamically compensate for local variations in height of microstructures located on a plurality of objects spaced apart within a laser-processing site is provided. The method includes providing reference data which represents 3-D locations of microstructures to be processed within the site, positioning the waist of the laser beam along an optical axis based on the reference data, and positioning the objects in a plane based on the reference data so that the waist of the laser beam substantially coincides with the 3-D locations of the microstructures within the site.

The objects may be semiconductor dice of a semiconductor wafer wherein the microstructures are conductive metal lines of the dice.

The objects may be semiconductor memory devices.

The step of providing may include the step of measuring height of the semiconductor wafer at a plurality of locations about the site to obtain reference height data. The step of providing may further include the steps of computing a reference surface based on the reference height data and generating trajectories for the wafer and the waist of the laser beam based on the reference surface.

The reference surface may be planar or non-planar.

The method may further include varying size of the waist of the laser beam about the optical axis.

The step of providing may include the steps of reducing power of the material-processing laser beam to obtain a probe laser beam and utilizing the probe laser beam to perform the step of measuring.

Further in carrying out the above objects and other objects of the present invention, a system for precisely positioning a waist of a material-processing laser beam to dynamically compensate for local variations in height of microstructures located on a plurality of objects spaced apart within a laser-processing site is provided. The system includes a focusing lens subsystem for focusing a laser beam along an optical axis, a first actuator for moving the objects in a plane, and a second actuator for moving the focusing lens subsystem along the optical axis. The system further includes a first controller for controlling the first actuator based on reference data which represents 3-D locations of microstructures to be processed within the site, and a second controller for controlling of the second actuator also based on the reference data. The first and second actuators controllably move the objects and the focusing lens subsystem, respectively, to precisely position the waist of the laser beam and the objects so that the waist substantially coincides with the 3-D locations of the microstructures within the site.

A support supports the second actuator and the focusing lens subsystem for movement along the optical axis.

The system may further include a spot size lens subsystem for controlling size of the waist of the laser beam, a third actuator for moving the spot size lens subsystem wherein the support also supports the spot size lens subsystem and the third actuator for movement along the optical axis, and a third controller for controlling the third actuator.

The first actuator may be an x-y stage.

The second and third actuators may be air bearing sleds for supporting the focusing lens subsystem and the spot size lens subsystem, respectively, both mounted for sliding movement on the support.

A voice coil is coupled to its respective controller for positioning its air bearing sled along the optical axis.

The system may further include a position sensor such as a capacitive feedback sensor for sensing position of the focusing lens subsystem and providing a position feedback signal to the second controller.

The laser beam may be a Gaussian laser beam.

The system may further include a trajectory planner coupled to the first and second controllers for generating trajectories for the wafer and the waist of the laser beam. At least one of the trajectories may have an acceleration/deceleration profile.

The system may further include a modulator for reducing power of the material-processing laser beam to obtain a probe laser beam to measure height of the semiconductor wafer at a plurality of locations about the site to obtain reference height data. The system may include a computer for computing a reference surface based on the reference height data wherein the trajectory planner generates the trajectories based on the reference surface which may be planar or non-planar.

The invention improves upon the prior art by including two steps:
1. Height measurements are performed at multiple (typically 4 or more) points surrounding the die site.
2. The focus (beam waist) height is adjusted as the laser beam is positioned within the site so as to maintain best focus throughout the site based on fitting a surface to multiple height measurements.

A method for high speed laser processing of microstructures having three dimensional coordinates includes the steps of:

Selecting a plurality of reference locations on a surface from which height data is to be obtained, obtaining height coordinates at the plurality of reference locations separate from but in proximity to micro-structures, estimating three dimensional locations of micro-structures from the coordinates of the reference locations, generating a trajectory adapted to position micro-structures relative to a location defining a laser processing beam axis, determining the position of an optical component disposed in path of the laser processing beam such that the corresponding position of the beam waist of the focused laser processing beam will substantially coincide with a coordinate of a micro-structure when the micro-structure is positioned to intersect the active laser processing beam, inducing relative movement between micro-structures and the location of a laser processing beam while coordinating the movement of the optical element in the path of the laser processing beam to dynamically adjust the position of the beam waist of the processing laser beam whereby the location of the beam waist substantially coincides with a coordinate of the micro-structure when it intersects the laser processing beam, providing a laser processing beam pulse to process the microstructure while relative movement is occurring between the micro-structures and the laser processing beam.

The height information will preferably be obtained from the same laser and optical path used for processing, but with reduced power (with a modulator used to reduce the power and avoid damage to the surface).

Alternatively, a separate tool may be used to measure the height of the surface at reference locations.

In a construction of the invention, the estimated surface location may be computed from a planar fit, higher order surface fit, through bilinear interpolation.

A straight line approximation may be used for microstructures located in a row.

The preferred optical system has capability for both spot size selection and focus control.

The optical focusing system is preferably mounted on an air bearing sled.

In a preferred system, spot size adjustment is provided with zoom elements mounted on an air bearing sled which independently adjusts spot size.

In a preferred system a high precision voice coil motor is mounted to the optical box and operatively connected to the air bearing sled.

In a preferred system, the position of the focusing optical system is monitored with a high band width position sensor, such as a capacitive feedback sensor.

In a preferred construction the positioning of the lens or optical element provides Z-axis resolution of about 0.1 um with a half power bandwidth of about 150 Hz.

In a preferred construction of the present invention, the maximum velocity of the wafer movement stage during processing is in the range of about 50–150 mm/sec.

The preferred range of movement of the optical element corresponds to about 3 mm movement range of the beam waist along the Z direction.

In a construction of the invention, the response of the actuator controlling the beam waist position can correspond to an incremental change in depth within a duration of about 0.03 msec.

A numerical offset may be introduced to compensate for the thickness of overlying passivation layers covering the micro-structure, or other offsets with respect to the reference surface.

The spot size at the three-dimensional coordinate of the microstructure is preferably within 10% of the diffraction limited (smallest) spot size after relative movement of an optical element.

The energy enclosure at the three-dimensional coordinate of the microstructure preferably exceeds 95% size after relative movement of an optical element.

The peak energy of the processing laser spot will preferably exceed 90% of the maximum peak energy.

The laser beam may be substantially Gaussian and TEM00.

The z coordinate of the beam waist is preferably dynamically adjusted and follows a computed surface, such as a plane. The corresponding change in depth between any two structures, including adjacent structures in a row of microstructures, may exceed the Z-axis resolution of the optical system positioner within a die.

The z coordinate of the beam waist is preferably dynamically adjusted and follows a computed surface, such as a plane. The corresponding change in depth between any two structures, including adjacent die on the wafer, may exceed the DOF of the laser beam.

A dimension of a microstructure may be less than the wavelength of the laser, for example: 0.8 $\mu$m width, 6 $\mu$m length, 1 $\mu$m thickness spaced apart by about 1.5 $\mu$m–3 $\mu$m from center-to-center.

The tolerable DOF of the laser beam may be on the order of or less than 1 wavelength of the laser processing beam.

The tolerable DOF of the laser beam may be less than 1 um.

The optical element may be moving the position of the beam waist in response to a continuous motion signal while the laser processing of the microstructure is occurring.

The optical element may be moving the position of the beam waist during the relative motion of the laser and micro-structures.

The relative motion of the lens may be constant, or may have acceleration/deceleration profiles provided by a trajectory planner.

A system of the present invention is able to operate with smaller spot sizes (which require better focus control) and thereby process devices with smaller geometry than prior memory repair systems due in part to superior focus control.

Dynamic Focus allows a system of the present invention to adapt to the non-parallel and non-planar topology that is typically found on real wafers and maintain acceptable focus over the full extent of a die site.

The method and system of the present invention is to be advantageously applied to semiconductor memory repair. However, it will be apparent that the present invention is also advantageous for microscopic laser processing applications where the depth of focus is small compared to the local height variations in the surface, and where the laser processing is to occur at high speed.

BRIEF DESCRIPTION OF DRAWINGS

FIG. 7b is a schematic diagram illustrating the diameter of a Gaussian laser beam prior to, at and after its minimum spot size;

FIGS. 8a–8c illustrate the assembly details and operation of the high-speed lens positioning system used for adjusting the beam waist (focus) position between adjacent links to be processed;

FIG. 9 illustrates details of a preferred lens arrangement and positioning system advantageous for use in practicing the present invention;

BEST MODE FOR CARRYING OUT THE INVENTION

Figure 2:
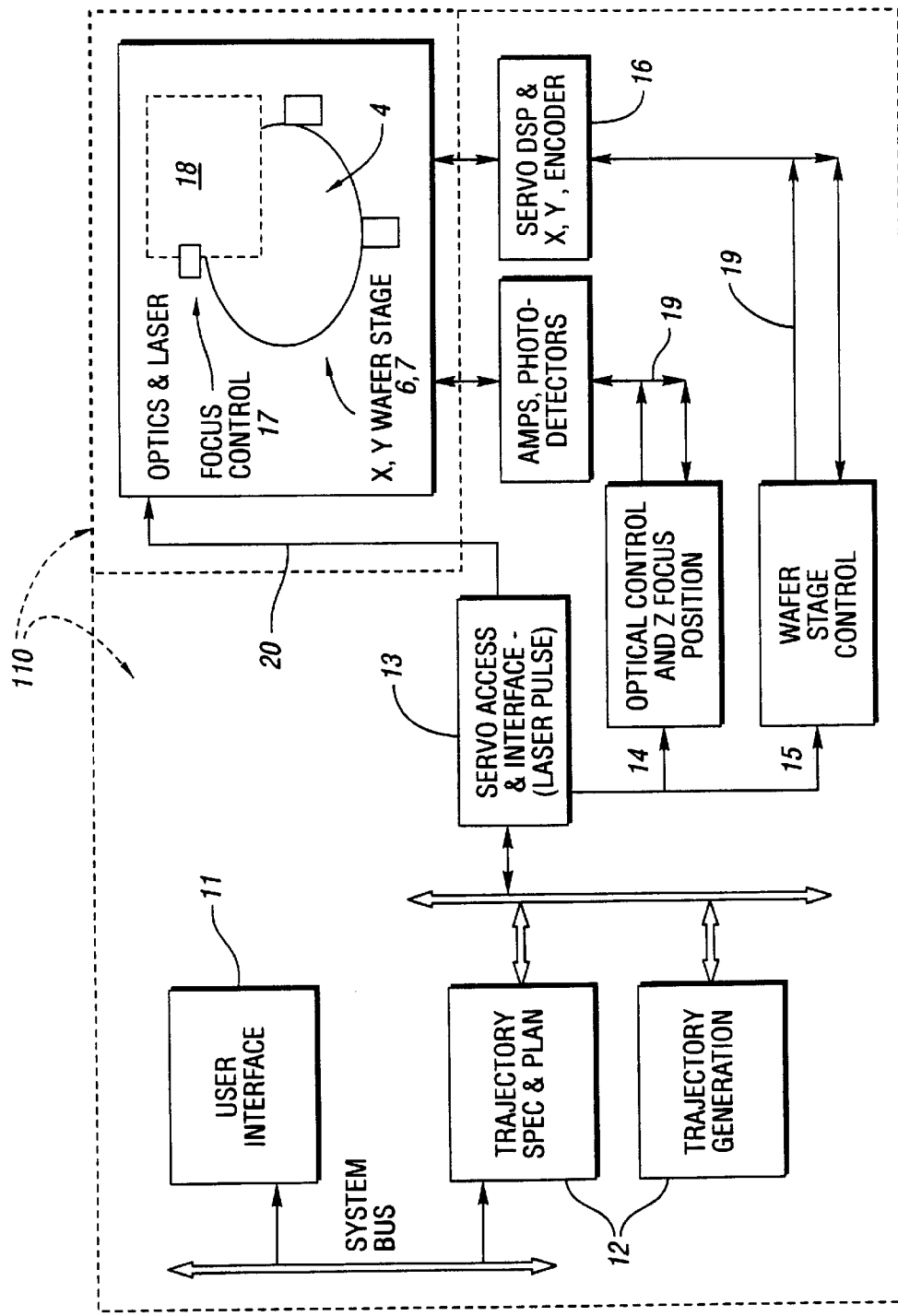
FIG. 2 is a detailed schematic block diagram of a memory repair system in accordance with the present invention showing the major sub-systems.

A preferred system of the present invention is shown in FIG. 2. A wafer 4 is positioned within the laser processing system 110 and database information from the user interface 11 is provided to identify the links (33 in FIG. 4) on the wafer which are to be ablated to repair defective memory cells.

Figure 3:
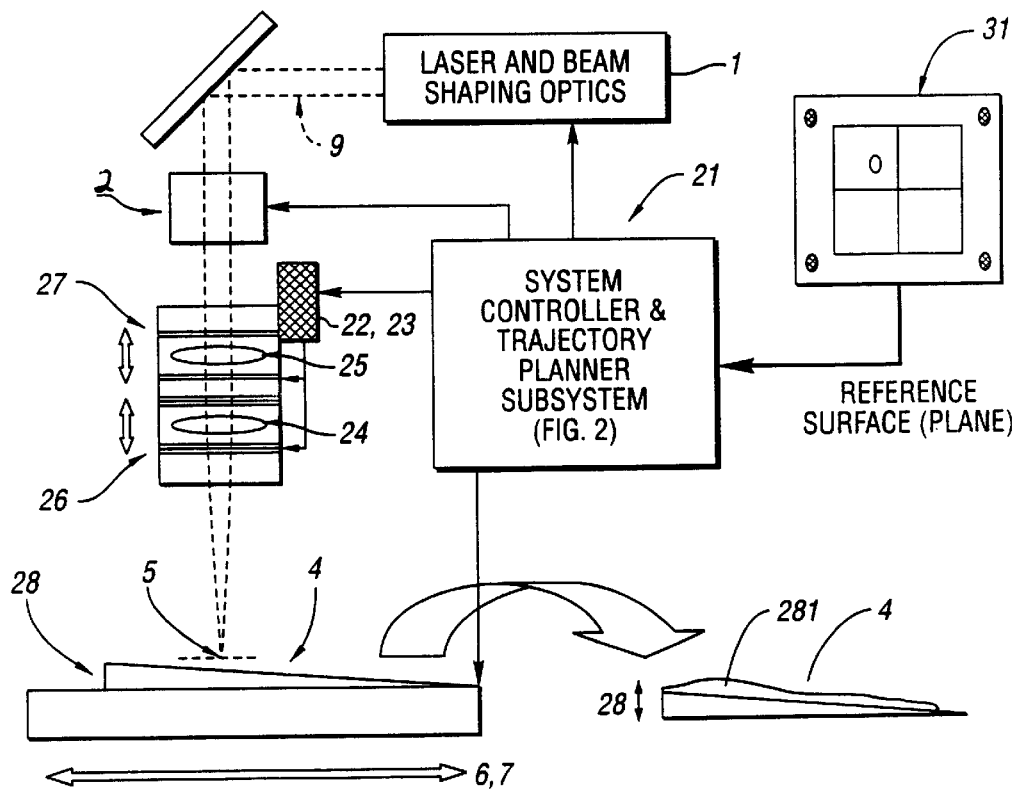
FIG. 3 is a schematic block diagram, similar to the diagram of FIG. 1, of the optical subsystem of the present invention showing the interaction with control systems used for wafer processing, including the trajectory generation subsystem.

Referring to FIG. 3, wafers exhibit wedge 28 (i.e. a plane that is tilted with respect to the focal plane) and non-planar topology 281 which requires compensation. The wedge 28 and local curvature 281 are exaggerated in scale for the purpose of illustration. Based upon the specified locations of the defective cells regions are identified on the wafer (33 in FIG. 4) in reference height data is to be obtained. Such locations may be "bare wafer" regions that have little surface texture or other suitably defined regions that are generally selected to match the imaging and processing capabilities of the measurement sensor. Typically depth information will be obtained using a "depth from focus" algorithm, and may be obtained using the laser operated with lower incident power resulting through operation of the modulator 2. A reference surface is defined from the surface height information through mathematical techniques for surface fitting. The ideal wafer surface (one that does not require compensation) is a plane that is parallel to the focal plane of the optical system 5, but slight non-orthogonality of the x, y system relative to the optical axis and/or surface variations produce significant height deviations 28.

Referring again to FIG. 2, the computed reference surface is used by the trajectory planner 12 and a DSP based controller 15, 16 in conjunction with motion stage 6, 7, 26 calibration to define motion segments for the trajectory generator which are executed and coordinated with laser 1, focusing optics 24, and x, y stages 6, 7 operation to ablate links. This operation includes control of x, y motion with preferred high speed precision stages 6, 7 and simultaneous positioning of optical elements 24 to position the beam waist 5 of processing laser 1 to coincide with a coordinate of the link 33 when the laser is pulsed.

Figure 1:
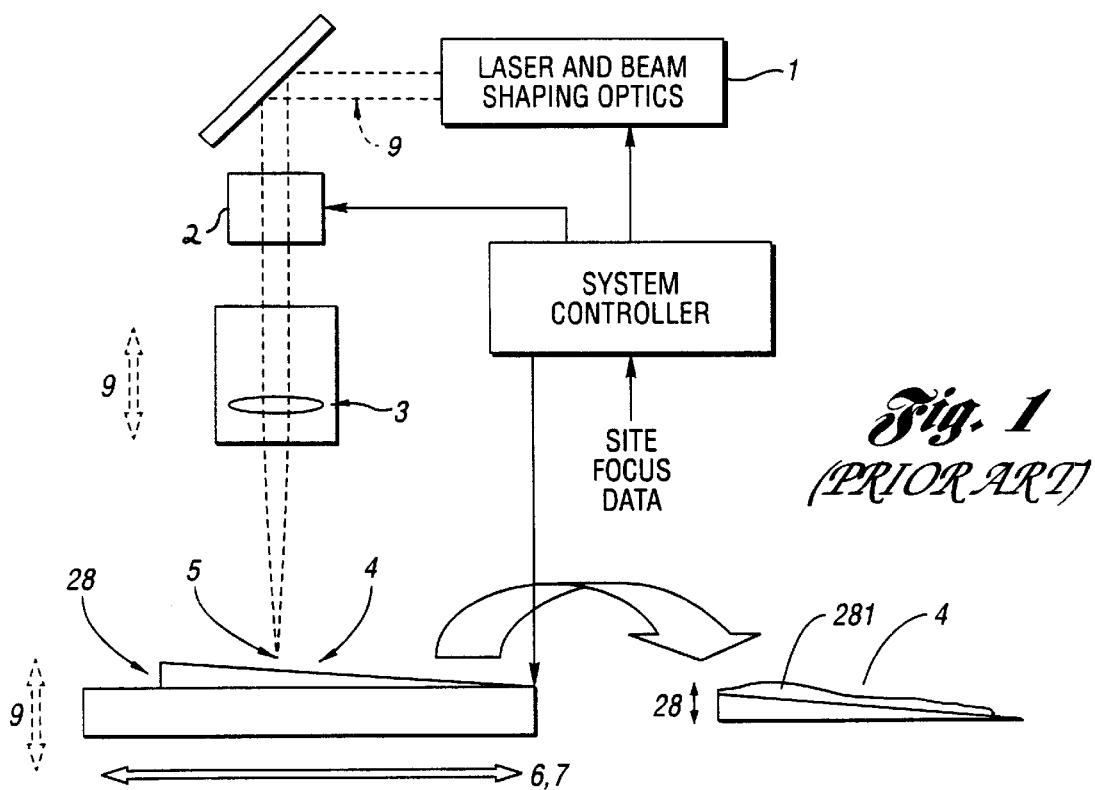
FIG. 1 is a schematic block diagram showing a prior art system for semiconductor memory repair.

All memory repair systems include some dynamic mechanism to provide relative motion between the wafer surface and the focal plane. In some cases, this may involve controlling the height of the wafer 4 relative to a fixed height optical path 3 as shown in FIG. 1 by movement 9 along the z-axis. Alternatively the motion 9 may utilize movement of the lens 3 in a "stepwise" manner to coincide with a location in depth derived from focus data from a die of site.

With the present invention the overall height of the wafer remains constant and the final objective lens height is controlled by a linear servo mechanism 22, 23 and controller 14, 17. The positioning of the lens or optical element with a preferred arrangement using a precision positioning system 22–27 for Z axis movement provides Z-axis resolution of about 0.1 um or finer with a 3DB "small signal" bandwidth of about 150 Hz, over a typical maximum range of movement of about 3 mm.

The following description provides additional detail for operation and construction of the preferred system of the invention. However, the embodiment and variations described below is intended to be illustrative rather than restrictive etc.

Selecting Reference Regions and Obtaining Data

A system for link blowing will generally require processing (i.e. laser ablation) of a subset 33 of a large number of links 34 on a wafer. The information which defines the links to be processed is provided to a control program. The program in turn will define a set of reference locations 32 surrounding a number of die 35 to be processed—i.e. a "site". The locations will generally include a sufficient number of points to accurately define a trajectory to be followed by the wafer and lens system based upon commands generated for motion system control.

At each reference location height or "focus position" is measured using an auto-focus or more precisely a "depth from focus" sensor. In a preferred system scans occur over a fixed x, y location target while continually adjusting the beam waist position over a range of heights (z-axis positions). The contrast in each scan is recorded at each height. When the laser is in best focus, the contrast in the scan will be maximized. Errors occur in the auto-focus routine due to random fluctuations in the laser during the scan and mechanical vibrations in the system. The high power processing beam may be used if the modulator 2 is used to control the power delivered to the surface.

The reference information and computed surface provide exact compensation for planar topology 28 that is either parallel or non-parallel to the focal plane. In the case of parallel and planar topology, the dynamic focus method of the present invention is an improvement over prior art. Multiple reference sites 32 provide "best estimates" of a surface and improved measurement and statistical confidence in the presence of sensor noise and mechanism errors.

For non-planar topology (ex: convex or concave surfaces), the Dynamic Focus method of the present invention is an improvement, though still non-ideal solution. With non-planar topology 281, as illustrated in FIGS. 1 and 3, a satisfactory participation will typically be a best-fit plane. A plane can closely approximate many surface shapes as long as the minimum radii of curvature of the actual surface is large (recognize that a plane is a curve with infinite radius of curvature). For typical wafer surfaces, the best-fit plane approximation is sufficient to compensate for the majority of wafer topology with residual errors (deviation from best-fit plane) comparable to the other error sources listed earlier.

The dynamic focus method and system of the present invention can be used in a variety of modes based on the form of topology that is assumed.

Mode 0:

Dynamic Focus will function similar to typical prior focus systems when operated in Mode 0. A single focus measurement is made at one location, for example a die within a die-site, and a parallel plane is assumed for all locations within the site. Dynamic Focus offers no advantage over conventional solutions when operated in this manner.

Mode 1:

Making multiple focus measurements around the die site and using the average focus height as the parallel plane can make a slight improvement over Mode 0. This is referred to as Mode 1. There would be little reason to use this mode unless there were a good reason to believe that the actual wafer topology is indeed a parallel plane and that the largest focus error to be corrected is due to focus Mode 2:

Two non-collocated focus measurements can be used to fit a tilted plane that contains the 2 measured focus heights, but is otherwise parallel to the focal plane. Specifically, a line perpendicular to the line containing the 2 focus measurements is parallel to the focal plane. This mode is best considered as a degenerate case of the subsequent modes.

Mode 3:

Three non-collinear focus measurements are the minimum number necessary to describe a best-fit plane for the die-site. This is a substantial improvement over Modes 0–2 as long as wafer topology is a larger source of error than focus measurement (generally the case).

Figure 4:
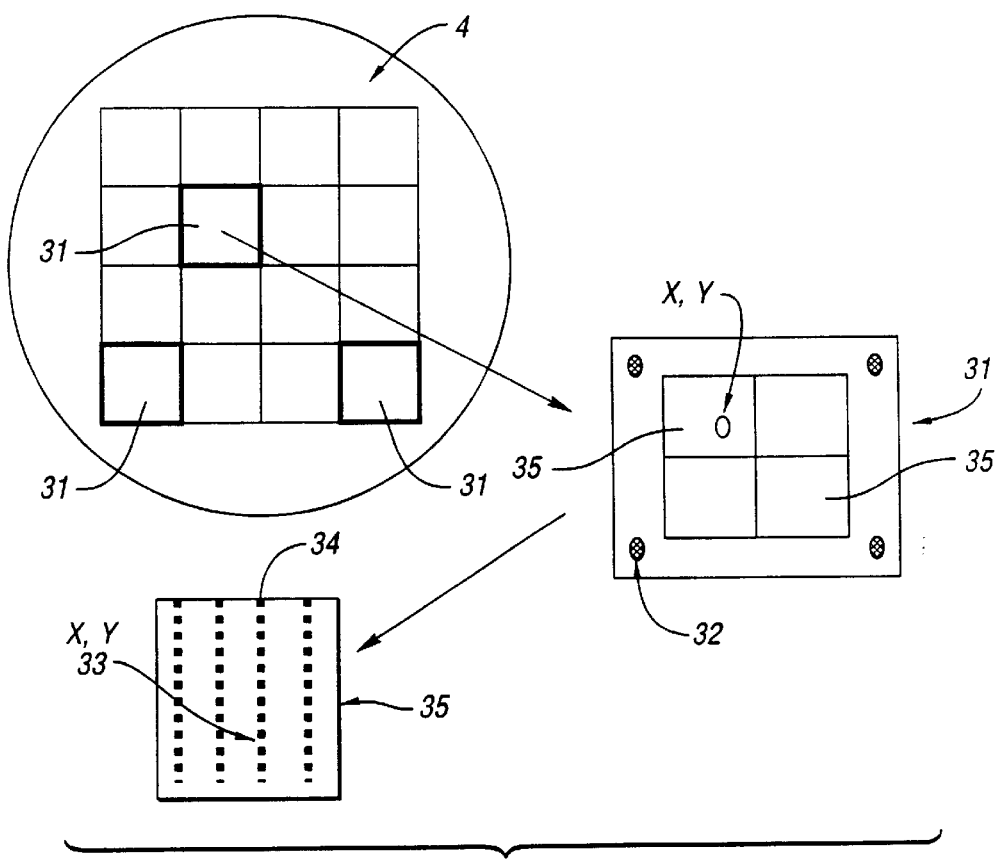
FIG. 4 is an exemplary illustration showing a wafer processing site comprising several die and associated regions where reference regions are located to define a reference surface.
Figure 6:
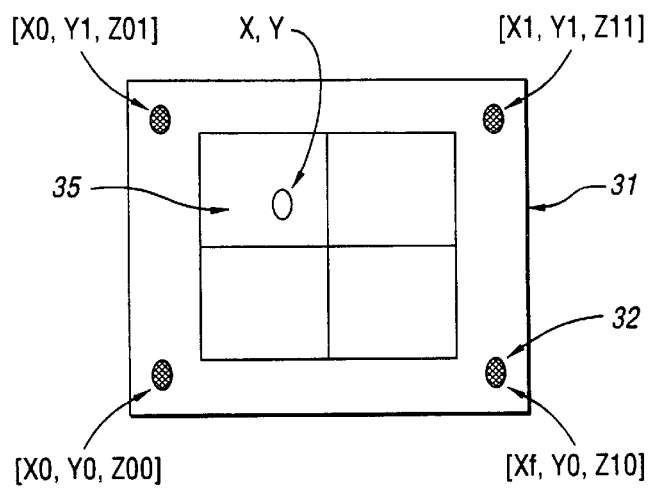
FIG. 6 is an illustration of the process of fitting a plane with bilinear interpolation.

Mode 4:

Refer to FIGS. 4 and 6. Four non-collocated and non-collinear focus measurements (generally taken at the 4 corners of a die-site) provide a further improvement over Mode 3 in the presence of non-zero measurement error. If there is reason to believe that focus measurement contributes more error than the best-fit plane assumption, then the 4 measurements can be used to solve for the best-fit plane. In this case, the $4^{th}$ measurement is providing a slight bit of averaging to the other 3 measurements to help reduce errors due to focus measurement.

Referring now to FIGS. 1 and 6. If wafer topology 4 is believed to be a larger source of error than height measurement, then the 4 measurements 32 can be used to construct a "twisted plane." A twisted plane is a bi-linear interpolation of the 4 height measurements. A bi-linear interpolation produces the height measurements exactly when evaluated at the focus reference sites and smoothly interpolates between the measurements at all other points.

Beam waist position at a point x,y within the site is given by the equation:

$$Z = Xg \cdot Yg \cdot Z00 + Xf \cdot Yg \cdot Z10 + Xf \cdot Yf \cdot Z11 + Xg \cdot Yf \cdot Z01$$

wherein:

$$Xf = \frac{X - X0}{X1 - X0} \quad Xg = 1 - Xf \quad Yf = \frac{Y - Y0}{Y1 - Y0} \quad Yg = 1 - Yf$$

It will be apparent those skilled in the art of measurement that the use of least squares fitting of additional reference points may improve the results. Further, if advantageous, additional data may be collected and used to fit a higher order quadratic or cubic surface. For a given laser processing application the number of samples and the choice of reference surface generally depend upon the maximum rate of change expected over the region to be sampled.

Trajectory Planning and Generation

A "trajectory planner" 12 is utilized to plan the path of the wafer 4 and beam waist position 5 with a motion system 6, 7, 17 and associated DSP based controller 16. Included as part of the present invention is a high-speed precision actuator 22, 23 for the lens system 24, 25. The trajectory planner integrates information from the user interface and alignment system 11 that is used to define the position of the laser relative to the targets (the latter typically mounted on a precision stage, for instance, a wafer stage) in a coordinate system. From the database the information is derived, resulting in a "link map", die selection, and other pertinent data regarding the memory repair operation.

Those skilled in the art of motion control and estimation will appreciate the tolerance budget requirement for accurate three-dimensional positioning in a high-speed memory repair processing system. A fraction of a micron, over a maximum range of travel of about 300 mm or more, corresponds to the entire area of a modern wafer. Processing or "cutting speeds" exceeding 50 mm/sec. are advantageous. Also, the above-noted copending utility patent application entitled "Precision Positioning Apparatus," (now allowed) and incorporated by reference describes details of a preferred wafer positioning system.

Figure 5:
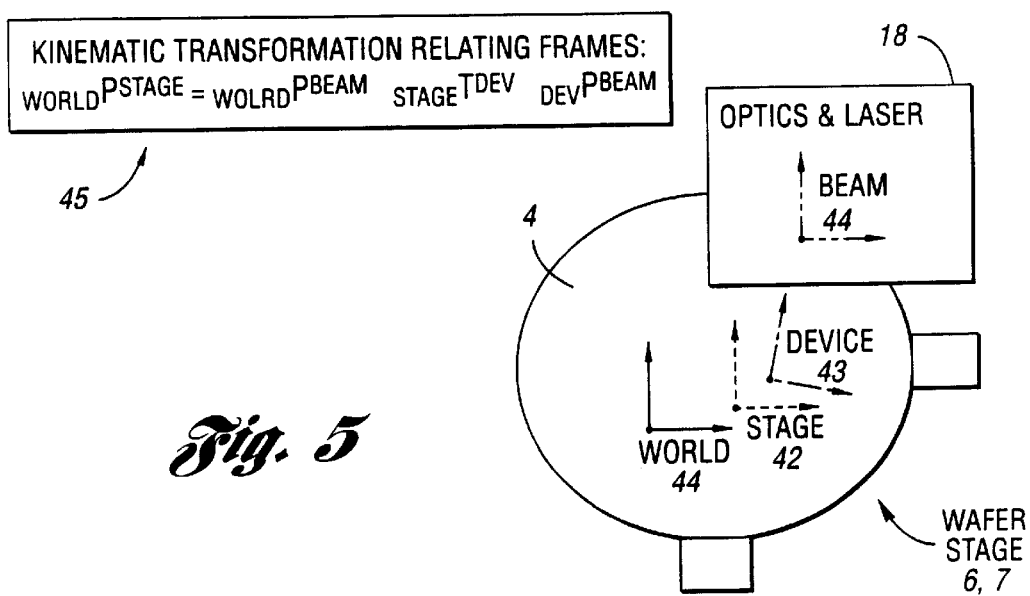
FIG. 5 illustrates a preferred coordinate system used for transformations to specify the location of a laser beam relative to a processing site in a laser processing system utilizing a precision positioning system.

In a preferred embodiment of the present invention trajectory generation will include a relative coordinate system organized as illustrated in FIG. 5 into "world" 41, "stage" 42, "device" 43 and "beam" 44 coordinates, as illustrated by the following kinematic transformation:

$$_{WORLD}P^{STAGE} = {_{WORLD}P^{BEAM}} \cdot {_{STAGE}T^{DEV}} \cdot {_{DEV}P^{BEAM}}$$

World.

The world frame is attached to the machine base. The origin is located at the midpoint between the two X,Y motion encoder read heads fixed to the base, and its Y axis passes through the center of each read head.

Beam.

The beam frame is attached to the optics box 18. The origin is located at the center of the focused laser spot.

Stage.

Attached to the wafer stage 6,7. It is coincident with the world frame when the stage is at the wafer load position (lift pin holes aligned with lift pins).

Device.

This frame, abbreviated as "dev", is attached to the wafer stage. Preferably beam motion is always commanded relative to the device frame. The device frame is arbitrarily defined by the user, to correct for die alignment, for example. The transformation from stage to device frame is a six-parameter linear transform, not a rigid-body one. For this reason the device frame is deliberately show as a distorted frame.

The kinematic transformation relates the frames. A system definition which specifies the motion at the path of the laser beam 5 with respect to a user defined device coordinate system is a convenient architecture as related to link blowing, though other applications may vary from such an architecture. In general, the transformation T in FIG. 5 relating stage coordinates to the device frame is a six parameter linear transformation as opposed to a rigid body. Those skilled in the art of motion control, particularly as implemented in multi-axis robotic systems, will recognize and be familiar with concepts and conventions of reference (coordinate) frames and coordinate transforms. In a preferred implementation a calibration step is included for all the motion stages which will result in data which is used in subsequent coordinate transformations (e.g. translation, rotation, scaling) to accurately relate all the coordinate systems and mathematical transforms.

In operation, beam focus position 5 is adjusted "on the fly" to preferably position the central portion (minimum width) 62 of the focused Gaussian laser beam 5 to coincide with the link to be processed. The focus subsystem 90, which is shown in FIGS. 8–9 and will be described in more detail later, preferably includes a high performance linear voice coil motor and associated circuitry 22, 23 mounted to the optical sub-system. To position the beam waist the surface generated from the reference data provides the required coordinate information. In a preferred embodiment the resultant heights are constructed in the "stage" coordinate frame 42 because the "device" frame 43 will be altered after focus correction by subsequent die alignment. However, those skilled in the art will recognize that many variations can exist dependent upon specific application requirements.

Positioning the Optical Components

Figure 7A:
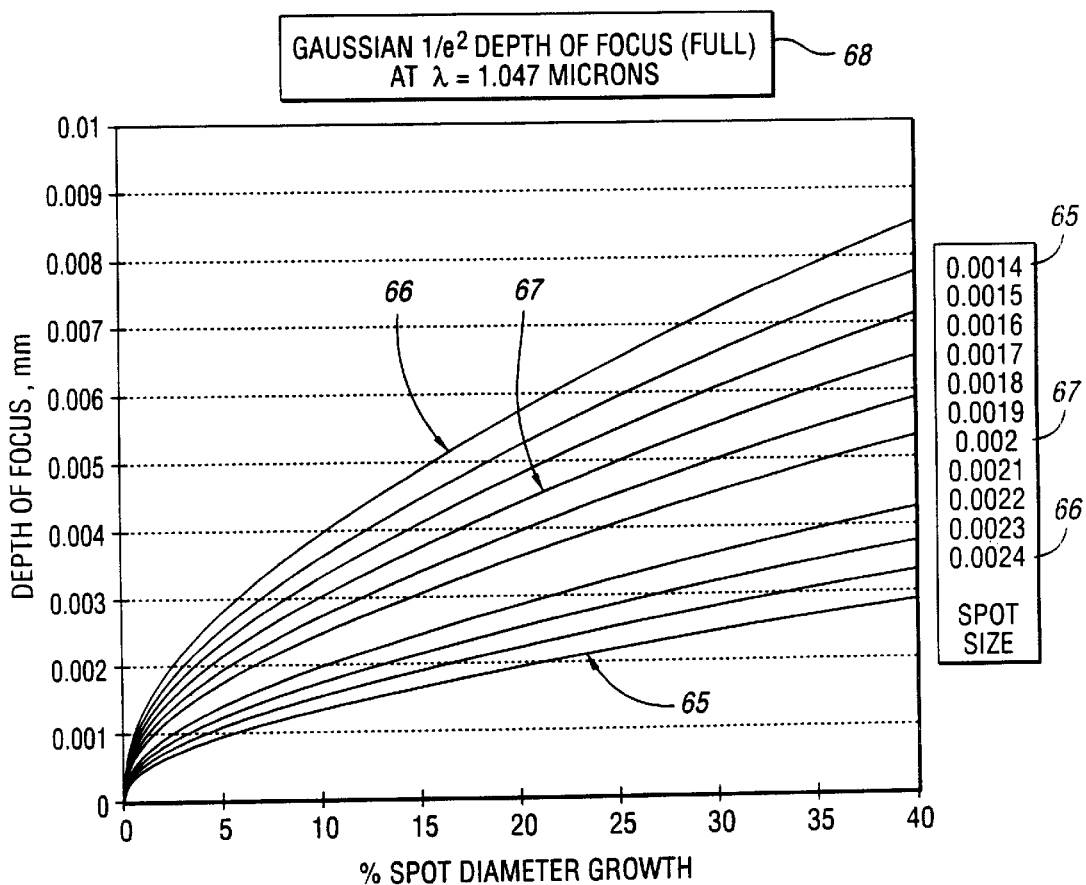
FIG. 7a is a graph showing the available depth of focus (and DOF tolerance) as a function of spot size consistent with the requirements of link processing.

The precision lens system 24, 84 will be positioned so the beam waist 5, 62 at the intersection of the link so that the link 33 is severed without damage to adjacent structures by the laser. The relative movement may be on the order of 1 micron or finer between adjacent links, with peak to peak movement of perhaps tens of microns over the wafer at the preferred processing speeds. In a preferred system the optics will provide programmable spot size control with lens system 25, 85 in addition to focus (beam waist) control. Those skilled in the art of laser beam manipulation will appreciate the tolerances required for positioning in such a way to enclose nearly all of the laser energy within the link area, corresponding to a small fractional loss of peak energy at the center of the beam. FIG. 7a illustrates the depth of focus (for specific DOF tolerances) for an ideal focused Gaussian beam laser having a wavelength of 1.047 um. The DOF depends upon the lens numerical aperture, laser wavelength, and is affected by beam truncation and other factors. Sub-micron tolerances are present, and the link sizes encountered in present link blowing systems are less than 1 $\mu$m in a dimension, for example, 0.5 $\mu$m wide and 6 $\mu$m length on center-to-center spacings of about 1.5–3 $\mu$m. Graph 65 is representative of requirements for state of the art memory repair systems. If total spot size growth of only 5% is required to ablate the link the total DOF is about 1 um, or ±0.5 um relative to the position of best focus, for example. A standard DOF criteria (often used) of 40% is not acceptable for link blowing applications.

FIG. 9 shows optical details of a preferred direct, unleveraged lens system. The input beam 91 is nominally collimated and the voice coil 23 maintains the laser spot in the calculated target field as determined by the trajectory planner 12. The objective 24 translates on an air bearing sled 26. The preferred embodiment has the advantage of a common, precision optical axis for both spot size change and rapid focus adjustment. The zoom beam expander 25 is optically compensated to maintain the collimation with spot size change, and a small residual error is accommodated with the dynamic focus objective 24.

The relationship between the depth of the beam waist and the position of the link is computed via the trajectory planner 12. Given a detailed prescription of the lens surface positions, indices of refraction those skilled in the art can make use of standard ray trace methods for Gaussian laser beams to calculate the change in depth of the beam waist as a function of the translation of the focusing assembly.

FIGS. 8a–8c show in detail a preferred construction of the opto-mechanical system of the present invention in the form of an assembly drawing. A precision V-block assembly 81 is used for the z-axis dynamic focus assembly. The air bearing sleds 83 are used for positioning both the objective lens 84 and zoom lens 85, and is advantageous for overcoming limitations in accuracy and reliability. The use of hard bearings would be problematic at the fine scale of movement (within DOF tolerance—<0.1 um increments) and at the relatively high frequency (typically 100–250 Hz). In addition to noise and reliability issues (ie: wearing mechanical parts) X,Y displacements during Z axis motion are much better controlled or eliminated with the air bearing system. Such displacements, even if a fraction of a micron, can lead to link severing results which are incomplete (ie: contamination) or possibly damage surrounding structures. The assembly step corresponding to 89 depicts the air bearing sleds within the v-block 81. Two independent voice coils 86 are used to position objective lens 84 and zoom telescope 85, with the zoom adjustment typically much less frequent. The diagram depicts the stators with a hollow (cut-out) region which allows for transmission of the processing beam through the system. The overall assembly 81 can be adjusted with hold down magnets to compensate for static offsets (e.g. pitch, roll).

Included with the z-axis optical assembly is a precision position sensing system 22, 23 with signals derived from a digital to analog converter, for instance a 16 bit device. The trajectory planner, which generates digital position data used by the motion system, is operatively connected to the DAC. The position sensor may be a capacitive feedback sensor which are commonly used with precision low inertia scanners (galvanometers) as described in *Laser Beam Scanning*, pp. 247–250, 1985, Marcel Dekker Inc. Other types of position sensors may also be used, for instance LVDTs (linear variable differential transformers) or precision linear encoders provided the requirements for low noise, high stability, and reliability are met.

In typical operation the preferred system has a range of travel of about 3 mm, a 3 db (small signal bandwidth) of about 250 Hz, and precision (repeatability) of about 46 nm (0.046 um). The 250 Hz bandwidth corresponds to a small signal rise time of about 1 msec. Improved results could potentially be achieved, for instance with a higher precision DAC. However, it is advantageous to operate the system in the approximate specified range because servo performance is important, and operation at a much higher bandwidth and associated high frequency noise could introduce performance limitations. As a threshold for performance this unit produces a significantly higher "speed-accuracy product" than what can be provided with z (wafer) stage movement, and is well adapted to follow a planar surface trajectory with precision within about one-tenth the tolerable DOF, with comparable x,y pointing stability.

It should be noted that this precision optical system 22–27 is also advantageous for obtaining the reference data, thereby eliminating any error in registration between a "probe" beam and the "processing" beam 9. In the preferred embodiment a modulator 2, typically an acousto-optic device or Pockels cell, is used to produce a low power beam for the focus measurements at the reference locations using the "depth of focus" procedure earlier described.

Relative Motion and Profiles

Figure 10A:
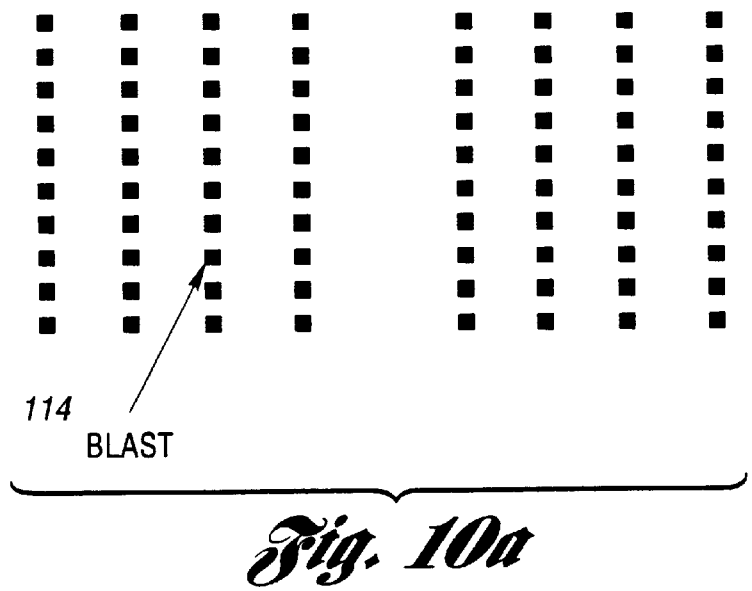
FIG. 10a is a schematic view of links of dice to be processed within a die site.
Figure 10B:
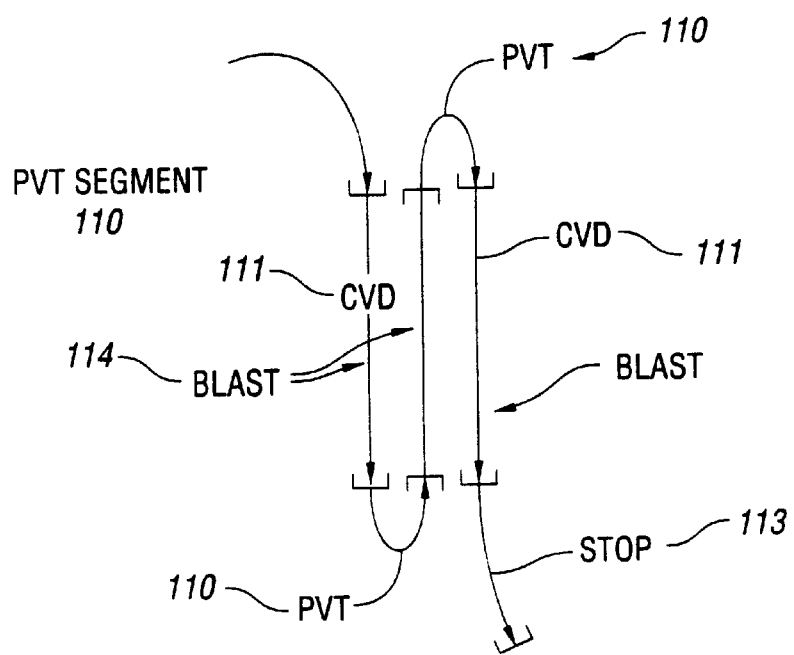
FIG. 10b is a schematic view of motion segment types generated by the system of the present invention.

When the three-dimensional coordinates of the laser beam and links to be processed are determined, a motion control program utilizes a trajectory generator 12 to efficiently process the target structures. Referring to FIGS. 10a and 10b, in a preferred system the acceleration and velocity profiles are associated with the following "motion segment" types:

1. PVT (Position/Velocity/Time) segment 110. It is used to accelerate to a desired position and velocity. The time required to traverse this segment is optional; if not specified, the minimum time is computed.
2. CVD (Constant-Velocity/Distance) segment 111. This type has only a single scalar specification: path length of the segment. The beam is to move at constant velocity for the specified distance. The velocity is that specified by the endpoint of the previous segment. Process control is typically executed during a CVD segment.
3. CVT (Constant-Velocity/Time) segment. This is the same as the CVD segment, but he segment's duration is specified rather than its length.
4. Stop Segment 113. This segment takes no specifications—it stops the stage as quickly as possible.

"Blast" refers to firing of the laser pulse to sever the links 114. Furthermore, a "stop" segment terminates motion, preferably as fast as possible. Process control and link blowing are most often associated with the constant velocity segment.

In a preferred system acceleration and velocity profiles are used to generate the x, y motion in cooperation with a DSP based servo controller 16. The lens translations along the optical axis are coordinated with the x, y motion so that the beam waist will be positioned at the target location when the laser is pulsed. Hence, with the present invention the z coordinate of the beam waist may be dynamically adjusted between any two structures on the wafer, including adjacent structures arranged in a row (along X or Y direction) on a single die. The incremental Z-axis resolution (smallest height difference) for link blowing is preferably about 0.1 um, for example, with about 0.05 um at the limit.

It should be noted that the reference surface may be offset by a fixed or variable level from the actual target (link) surface as a result of depositing layers (for instance an insulation layer) below the link (for instance). In a preferred system a parameter or variable will be included which will offset the beam waist position accordingly, either for a reference site or for the entire wafer, depending upon the level of layer thickness control.

Generating the Laser Pulse

The laser-processing beam is typically provided by a Q-switched YAG laser having a pre-determined pulse width, repetition rate, and wavelength as disclosed in U.S. Pat. No. 5,998,759. Alternatively, a fiber laser using a semiconductor diode seed laser and a fiber laser may be used to provide improved control over the temporal pulse shape, thereby allowing for processing of smaller links with less risk of damage to surrounding structures as described in co-pending application Ser. No. 09/473,926, filed Dec. 28, 1999. In either case a control signal 20 is supplied to the laser 1 which generates a pulse in coordination with the continuous positioning of the wafer and lens. Those skilled in the art will recognize the coordination of the laser and motion will most likely be compounded by instantaneous or cumulative position error. In a preferred embodiment a programmable firing delay is included that adjusts the previously "scheduled" laser pulses to compensate for such position errors. The time resolution of such correction is preferably 25 nanoseconds or less. Preferably, the complete error correction is defined by a "tracking vector" which converts the total position error into a delay. This tracking vector can be included with the transformation matrices 45 which are operatively connected to the controller for dynamically relating the coordinate systems of FIG. 5, for instance.

Conclusion

A primary advantage of the method and system of the present invention can be summarized as a "speed-resolution product" in 3 dimensions—where the control system for the wafer movement preferably provides continuous movement in 2 directions, and the high precision lens actuator provides smooth, continuous motion in the third dimension.

The alignment time is also reduced by estimating a surface that is used to define a trajectory.

Those skilled in the art will recognize various alternatives for trajectory planning, precision positioning of an optical system, and DSP based servo control techniques and other embodiments. However, the scope of the invention is to be limited only by the following claims.

What is claimed is:

1. A system for precisely positioning a waist of a material-processing laser beam to dynamically compensate for local variations in height of microstructures located on a plurality of objects spaced apart within a laser-processing site, the system comprising:
    a focusing lens subsystem for focusing a laser beam along an optical axis;
    a first actuator for moving the objects in a plane;
    a second actuator for moving the focusing lens subsystem along the optical axis;
    a first controller for controlling the first actuator based on reference data which represents 3-D locations of microstructures to be processed within the site; and
    a second controller for controlling of the second actuator also based on the reference data wherein the first and second actuators controllably move the objects and the focusing lens subsystem, respectively, to precisely position the waist of the laser beam and the objects so that the waist substantially coincides with the 3-D locations of the microstructures within the site.

2. The system as claimed in claim 1 further comprising a support for supporting the second actuator and the focusing lens subsystem for movement along the optical axis.

3. The system as claimed in claim 2 further comprising;
    a spot size lens subsystem for controlling size of the waist of the laser beam;
    a third actuator for moving the spot size lens subsystem wherein the support supports the spot lens subsystem and the third actuator for movement along the optical axis; and
    a third controller for controlling the third actuator.

4. The system as claimed in claim 1 wherein the first actuator is an x-y stage.

5. The system as claimed in claim 1 wherein the second actuator is an air bearing sled for supporting the focusing lens subsystem and mounted for sliding movement on the support.

6. The system as claimed in claim 3 wherein the third actuator is an air bearing sled for supporting the spot size lens subsystem and mounted for sliding movement on the support.

7. The system as claimed in claim 5 further comprising a voice coil coupled to the second controller for positioning the air bearing sled along the optical axis.

8. The system as claimed in claim 1 further comprising a position sensor for sensing position of the focusing lens subsystem and providing a position feedback signal to the second controller.

9. The system as claimed in claim 8 wherein the position sensor is a capacitive feedback sensor.

10. The system as claimed in claim 1 wherein the laser beam is a Gaussian laser beam.

11. The system as claimed in claim 1 wherein the objects are dice of a semiconductor wafer.

12. The system as claimed in claim 11 further comprising a trajectory planner coupled to the first and second controllers for generating trajectories for the wafer and the waist of the laser beam.

13. The system as claimed in claim 12 wherein at least one of the trajectories has an acceleration/deceleration profile.

14. The system as claimed in claim 12 further comprising a modulator for reducing power of the material-processing laser beam to obtain a probe laser beam to measure height of the semiconductor wafer at a plurality of locations about the site to obtain reference height data.

15. The system as claimed in claim 14 further comprising a computer for computing a reference surface based on the reference height data and wherein the trajectory planner generates the trajectories based on the reference surface.

16. The system as claimed in claim 15 wherein the reference surface is non-planar.

17. A system for precisely positioning a waist of a material-processing laser beam to dynamically compensate for local variations in height of microstructures spaced apart within a laser-processing site, the microstructure lying on a surface which is substantially orthogonal to an optical axis, the system comprising:

a first optical component for focusing the laser beam along the optical axis;

a first actuator for moving the axis of the laser beam relative to the microstructures;

a second actuator for moving the first optical component along the optical axis;

a first controller for controlling the first actuator based on reference data which represents 3-D locations of microstructures to be processed within the site; and a second controller for controlling of the second actuator also based on the reference data wherein the first and second actuators controllably move the axis of the laser beam relative to the objects and the focusing lens subsystem, respectively, to precisely position the axis of the laser beam so that the waist substantially coincides with the 3-D locations of the microstructures within the site.

18. The system of claim 17 wherein the bandwidth of the focusing lens positioning sub-system is about 150 hz or greater.

19. The system of claim 18 where the response of the second actuator results in controllable movement of the beam waist within about 0.03 msec or less.

20. The system of claim 18 wherein movement of the focusing lens is controllable within the depth of focus of the laser beam.

21. The system as claimed in claim 18 wherein the first optical component is a focusing lens.

22. The system as claimed in claim 21 further comprising:

a second optical component for controlling size of the waist of the laser beam;

a third actuator for moving the second optical component along the optical axis; and a third controller for controlling the third actuator.

23. The system as claimed in claim 17 wherein the first actuator is an x-y stage.

24. The system as claimed in claim 21 wherein the second actuator is an air bearing sled.

25. The system as claimed in claim 22 wherein the third actuator is an air bearing sled.

26. The system as claimed in claim 24 wherein the second controller includes a voice coil operatively connected to the air bearing sled.

27. The system as claimed in claim 17 further comprising a position sensor for sensing position of the second actuator and providing a position feedback signal to the second controller.

28. The system as claimed in claim 27 wherein the position sensor is capacitive feedback sensor.

29. The system as claimed in claim 17 wherein the laser beam is a Gaussian laser beam.

30. The system as claimed in claim 17 wherein the objects are dice of a semiconductor wafer.

31. The system as claimed in claim 30 further comprising a trajectory planner coupled to the first and second controllers for generating trajectories for the wafer and the waist of the laser beam.

32. The system as claimed in claim 31 wherein at least one of the trajectories has an acceleration/deceleration profile.

33. The system as claimed in claim 31 further comprising a modulator for reducing power of the material processing laser beam to obtain a probe laser beam to measure height of the semiconductor wafer at a plurality of locations about the site to obtain reference height data.

34. The system as claimed in claim 33 further comprising a computer for computing a reference surface based on the reference height data and wherein the trajectory planner generates the trajectories based on the reference surface.

35. The system as claimed in claim 34 wherein the reference surface is non-planar.

36. The system as claimed in claim 17 wherein movement of the focusing lens is controllable within one-half of the depth of focus of the laser beam.

37. The system as claimed in claim 17 wherein movement of the focusing lens is controllable within $1/10$ of the depth of focus of the laser beam.

* * * * *